United States Patent
Liang et al.

(10) Patent No.: US 11,641,724 B2
(45) Date of Patent: *May 2, 2023

(54) CONDUCTIVE PVD STACK-UP DESIGN TO IMPROVE RELIABILITY OF DEPOSITED ELECTRODES

(71) Applicant: Apple Inc., Cupertino, CA (US)

(72) Inventors: Jiahui Liang, Sunnyvale, CA (US); Anirban Das, Fremont, CA (US); Jungyup Kim, Palo Alto, CA (US); Martin Melcher, Mountain View, CA (US); Srinivasan Varadharajan, Dublin, CA (US); Wolf Oetting, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/649,167

(22) Filed: Jan. 27, 2022

(65) Prior Publication Data

US 2022/0151094 A1 May 12, 2022

Related U.S. Application Data

(63) Continuation of application No. 16/564,655, filed on Sep. 9, 2019, now Pat. No. 11,272,631.

(51) Int. Cl.
| | |
|---|---|
| *H05K 5/06* | (2006.01) |
| *C23C 14/06* | (2006.01) |
| *C23C 14/14* | (2006.01) |
| *G04G 17/08* | (2006.01) |
| *H05K 5/00* | (2006.01) |
| *H05K 5/02* | (2006.01) |
| *G09F 9/30* | (2006.01) |

(Continued)

(52) U.S. Cl.
CPC ......... *H05K 5/069* (2013.01); *C23C 14/0641* (2013.01); *C23C 14/14* (2013.01); *G04G 17/02* (2013.01); *G04G 17/08* (2013.01); *G09F 9/301* (2013.01); *H05K 5/0086* (2013.01); *H05K 5/0247* (2013.01); *H05K 5/03* (2013.01)

(58) Field of Classification Search
None
See application file for complete search history.

(56) References Cited

U.S. PATENT DOCUMENTS

| | | |
|---|---|---|
| 6,435,683 B1 | 8/2002 | Milner |
| 8,935,119 B2 | 1/2015 | Yuen |

(Continued)

FOREIGN PATENT DOCUMENTS

| | | |
|---|---|---|
| AU | 604173 B2 | 12/1990 |
| EP | 3451117 A1 | 3/2019 |

(Continued)

*Primary Examiner* — Xanthia C Cunningham
(74) *Attorney, Agent, or Firm* — Dorsey & Whitney LLP

(57) ABSTRACT

An electronic device can include a housing component that can define an interior surface and an exterior surface of the device, a metallic film deposited on the interior surface and extending at least partially onto the exterior surface, and a ceramic film deposited on the exterior surface and at least partially over a portion of the metallic film on the exterior surface. The ceramic film can be in electrical communication with a portion of the metallic film deposited on the interior surface to form an electrical pathway from the exterior surface to the interior surface.

20 Claims, 7 Drawing Sheets

(51) Int. Cl.
    *G04G 17/02*    (2006.01)
    *H05K 5/03*     (2006.01)

(56)          References Cited

U.S. PATENT DOCUMENTS

| | | |
|---|---|---|
| 10,037,642 B2 | 7/2018 | Padgett et al. |
| 10,082,830 B2 * | 9/2018 | Lettow .................... B62D 1/06 |
| 2012/0194976 A1 * | 8/2012 | Golko .................. G06F 1/1632 |
| | | 361/679.01 |
| 2015/0141784 A1 * | 5/2015 | Morun .................... G06F 3/014 |
| | | 427/79 |
| 2016/0157372 A1 * | 6/2016 | Hiroki .................. G06F 1/1652 |
| | | 361/679.01 |
| 2016/0252980 A1 * | 9/2016 | Park ........................ G01D 5/56 |
| | | 345/184 |
| 2016/0255733 A1 * | 9/2016 | Jung ...................... G04G 21/04 |
| | | 361/759 |
| 2016/0349789 A1 * | 12/2016 | Lee ....................... G06F 1/1698 |
| 2018/0103557 A1 * | 4/2018 | Wright .................... H01Q 1/38 |
| 2019/0069848 A1 | 3/2019 | Clavelle et al. |
| 2019/0074706 A1 | 3/2019 | Wittenberg et al. |
| 2019/0101870 A1 | 4/2019 | Pandya et al. |
| 2020/0194905 A1 * | 6/2020 | Wei ..................... A61B 5/0006 |

FOREIGN PATENT DOCUMENTS

| | | |
|---|---|---|
| JP | 6247633 B2 | 11/2017 |
| WO | 0003390 A1 | 1/2000 |
| WO | 2013020238 A1 | 2/2013 |

\* cited by examiner

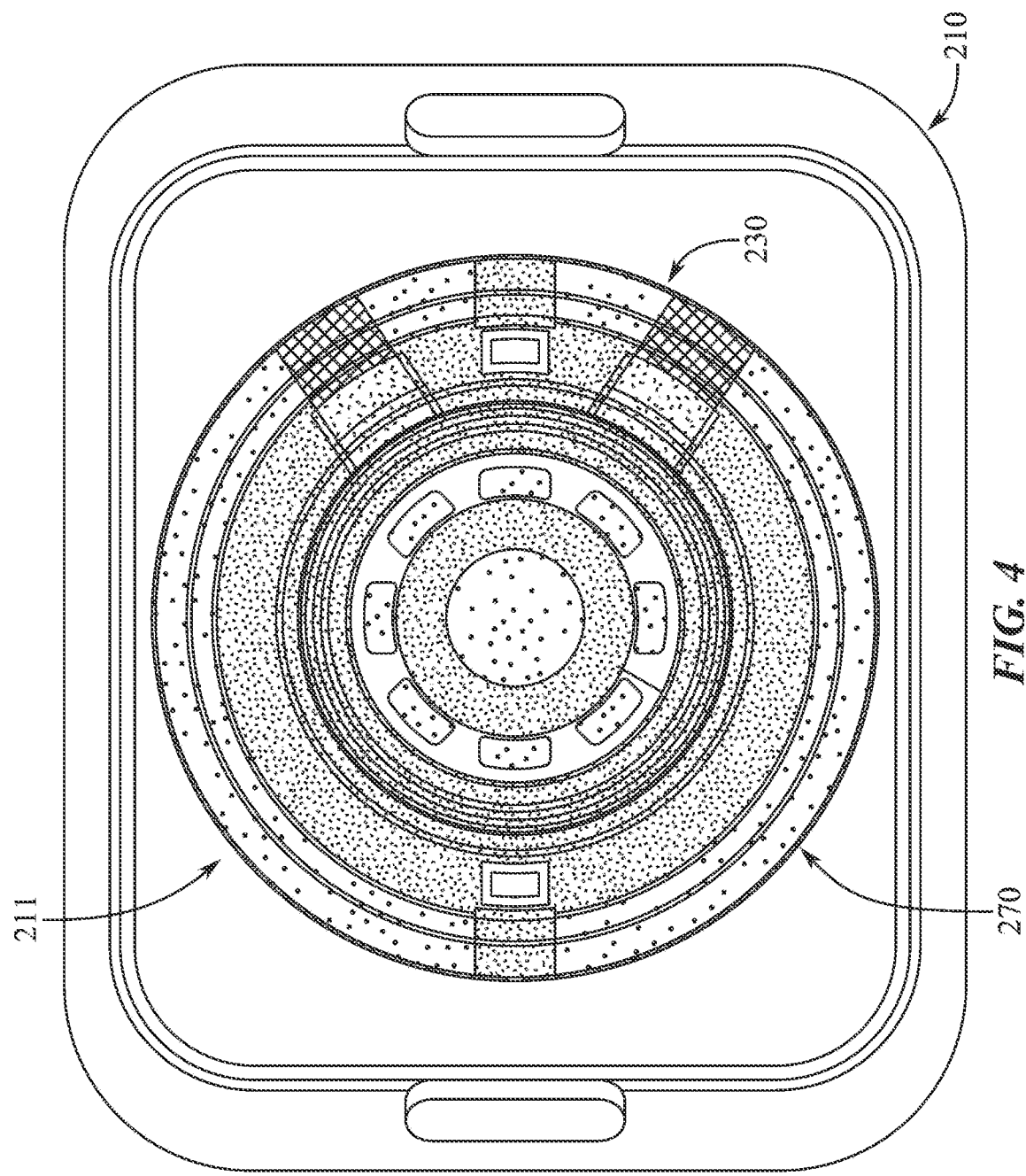

CONDUCTIVE PVD STACK-UP DESIGN TO IMPROVE RELIABILITY OF DEPOSITED ELECTRODES

CROSS-REFERENCE TO RELATED APPLICATIONS

This application is a continuation of U.S. application Ser. No. 16/564,655, filed Sep. 9, 2019 and entitled "CONDUCTIVE PVD STACK-UP DESIGN TO IMPROVE RELIABILITY OF DEPOSITED ELECTRODES," the disclosure of which is incorporated herein by reference in its entirety.

FIELD

The described embodiments relate generally to conductive coatings. More particularly, the present embodiments relate to thin film conductive coatings for electronic devices.

BACKGROUND

Electronic devices are increasingly being design with device portability in mind, for example, to allow users to use these devices in a wide variety of situations and environments. In the context of wearable devices, these devices can be designed to be operated in many different locations and environments, and can be exposed to a wide range of environment conditions, some of which can be particularly harsh on traditional or conventional electronic device designs.

At the same time, electronic devices continue to include increasingly large numbers of features, some of which can require the device to interact with, or be provided information from, the ambient environment. Conventional techniques for allowing a device to communicate with the environment, such as providing openings or apertures in the device housing to allow sensors to communicate with the environment, can become ingress points for environmental contaminants and can result in the retention of undesirable liquids or abrasive particles in the interior of the device. This retention or exposure to environmental materials or conditions can result in an undesired amount of degradation in the performance or operation of one or more features of the device. Further, such openings or ports can impact the cosmetic appearance of a device in ways that are not pleasing to a user.

As a result, it can be desirable to provide alternative components and methods for allowing communication between the ambient environment and components, such as sensors housed in the internal volume of a device, that do not include apertures or that do not expose portions of the internal volume of the device to environmental conditions.

SUMMARY

According to some aspects of the present disclosure, an electronic device can include a housing component defining an interior surface and an exterior surface of the device. A metallic film is deposited on the interior surface and extending at least partially onto the exterior surface, and a ceramic film is deposited on the exterior surface and at least partially over a portion of the metallic film on the exterior surface. The ceramic film is in electrical communication with a portion of the metallic film deposited on the interior surface.

In some examples, the electronic device can further include a seal isolating an internal volume of the electronic device at least partially defined by the interior surface from an ambient environment. The electronic device can also include an electronic component disposed in the internal volume and electrically coupled to the ceramic film, wherein the exterior surface is exposed to the ambient environment, and the metallic film and the ceramic film form are electrically coupled to the electronic component by a conductive ink. The metallic film can include at least one of chromium or titanium. The ceramic film can include a carbonitride. The interior surface can include a concave geometry and the exterior surface can include a convex geometry. The housing component can be transparent.

According to some aspects, a housing for an electronic device can include a conductive film deposited on a first surface of the housing that extends at least partially onto a second surface of the housing opposite the first surface, and a ceramic film deposited on the second surface and at least partially over a portion of the conductive film deposited on the second surface. The conductive film and the ceramic film can form an electrically conductive pathway extending across the first surface and the second surface.

In some examples, the housing can further include a conductive ink deposited over a portion of the conductive film deposited on the first surface. At least one of the ceramic film or the conductive film can be deposited by a physical vapor deposition process. The conductive film can include a first conductive layer in electrical contact with the first surface and a second conductive layer deposited on the second surface at least partially over the first conductive layer. The first conductive layer can be formed prior to the second conductive layer, and the ceramic film can be formed subsequent to the first conductive layer and the second conductive layer.

The first conductive layer can have a thickness of 100 nanometers and the second conductive film can have a thickness of 50 nanometers. The ceramic film can have a thickness of 1 micron. The conductive material can include at least one of chromium or titanium. The ceramic material can include a nitride forming the conductive material. The first surface can include a non-planar surface. The ceramic film can have an L* value of 55 to 65 in a CIELAB color space.

According to some aspects, a method of forming an electrically conductive housing component can include depositing a first conductive layer on a first surface of the housing component, depositing a second conductive layer on a second surface of the housing component opposite the first surface, the second conductive layer at least partially overlapping the first conductive layer, and depositing a ceramic layer over the second metallic film.

In some examples, the conductive layer can include at least one of chromium or titanium, and the ceramic layer can include a nitride material including at least one of chromium or titanium. The housing component can be a first housing component, and the method can further include sealing an interface between the first housing component and a second housing component.

BRIEF DESCRIPTION OF THE DRAWINGS

The disclosure will be readily understood by the following detailed description in conjunction with the accompanying drawings, wherein like reference numerals designate like structural elements, and in which:

FIG. 4 shows a top view of a portion of an electronic device including a component.

DETAILED DESCRIPTION

Figure 1:
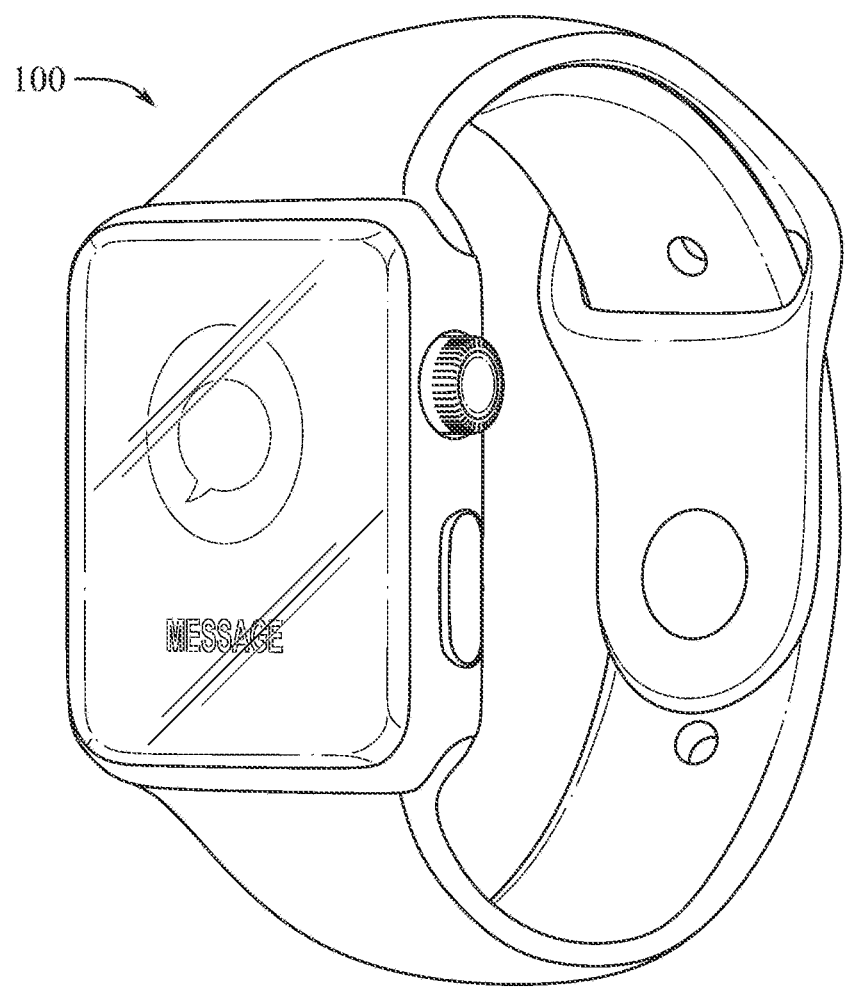
FIG. 1 shows a perspective view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments, as defined by the appended claims.

An electronic device can include a housing component that at least partially defines an interior surface and an exterior surface of the device. The interior surface can at least partially define an internal volume of the device. A metallic film can be deposited on the interior surface of the component and can extend at least partially onto the exterior surface. A ceramic film can be deposited on the exterior surface of the component and at least partially over the portion of the metallic film on the exterior surface. The ceramic film can be in electrical communication with the portion of the metallic film deposited on the interior surface to provide an electrical pathway from the exterior surface to the interior surface through both the ceramic film and the metallic film. The electronic device can further include a seal that can isolate the internal volume of the device from the ambient environment, and the electrical pathway defined by the ceramic film and the metallic film can provide a signal along the electrical pathway and across the seal to the internal volume of the device, where it can be communicated to one or more components, such as a sensors, that are contained in the internal volume of the device.

A portable electronic device can be made more robust by reducing and/or eliminating the number of openings leading from an internal volume defined by the device's housing to an exterior surface of the device housing. At the same time, however, it can be desirable to incorporate one or more sensors into the device that require communication with the external environment. For example, a conventional input/output port of a device can often include a cavity for receiving an electrical connector. This cavity can allow for the undesired ingress of liquid into at least a portion of the device housing. While such a cavity can be sealed from other portions of the internal volume of the device, the presence of corrosive liquids or debris can damage or degrade the operation of the device over time.

It can also be desirable to provide sensors in a device that can allow the device to monitor a user's biometric parameters. For example, a wearable device, owing to its generally continuous contact with user's skin while it is being worn, can include sensors that monitor one or more conditions of the user's skin, such as its electrical properties. These electrical properties can be tracked by the device over time to enable a wide variety of functions and features that can be desirable to a user. In order to achieve this functionality, however, a path must exist from the sensor, generally housed in the internal volume of the device, and the user's skin, positioned external to the device. As a result, similar problems with the undesired ingress of liquid or abrasive particles can be experienced by conventional device configurations.

As described herein, it can be desirable to provide an electrically conductive pathway that extends from an exterior surface of the device, across a seal or sealant material, and into the internal volume of the device, whereupon the pathway can be electrically coupled to one or more components, such as sensors. In some examples, this electrical pathway can be achieved by including a housing component that includes a layer of electrically conductive material that extends from an exterior surface of the component to an interior surface past a seal or water proofing element of the device housing.

For example, a layer or layers of material that can provide a desired level of electrical contact with a user's skin can be deposited upon and extend between peripheral regions of opposing surfaces of a first housing component. In some examples, these layers can be considered to be a contact electrode. When an interface between the first housing component and a second housing component is sealed, the deposited layer or layers can provide a robust electrically conductive pathway leading into and out of the housing without impacting the water-resistance of the device housing and without undesirably exposing portions of the internal volume of the device to environment conditions. In some examples, this electrically conductive pathway can relay electrical signals to thereby provide sensor readings and/or power between the inside and outside of the device housing.

In some examples, it can be beneficial to deposit the layer or layers forming the electrical pathway on a housing component at a location that is inconspicuous to a user. Further, it can be desirable to form the electrical pathway over a component that is substantially electrically insulating in order to prevent cross-talk or noise in the signal provided along the pathway. Accordingly, one or more layers of material can form a contact electrode defining an electrical pathway on a housing component. The layers of material can include a polymeric or ceramic material, such as polycarbonate, glass, or sapphire.

As the layers of the contact electrode are exposed to the ambient environment, however, it can be desirable to deposit layers that are able to withstand environmental exposure and typical use, while still providing a reliable electrical pathway to the interior of the device. In some examples, a contact electrode can be exposed to the ambient environment and everyday use without becoming worn, scratched off, delaminated, corroded, or otherwise degraded. Accordingly, in some examples, an exterior surface of a contact electrode can be formed from a material that has desired levels of hardness and corrosion resistance, while other layers of the contact electrode that are not be exposed to the environment can have relatively high levels of electrical conductivity and can be relatively ductile or deformable, for example, to prevent or reduce brittle failure and prevent, reduce, or withstand delamination of one or more layers of the contact electrode from the material of the component on which it is formed.

These and other embodiments are discussed below with reference to FIGS. 1-9. However, those skilled in the art will readily appreciate that the detailed description given herein with respect to these Figures is for explanatory purposes only and should not be construed as limiting.

FIG. 1 shows an embodiment of an electronic device 100. The electronic device shown in FIG. 1 is a wearable device, such as a smartwatch. The smartwatch 100 of FIG. 1 is merely one representative example of a device that can be used in conjunction with the components and methods disclosed herein. The electronic device 100 can correspond to any form of an electronic device, medical device, health-sensing device, a wearable electronic device, a portable media player, a media storage device, a portable digital assistant ("PDA"), a tablet computer, a computer, a mobile communication device, a GPS unit, a remote control device, and other devices. The electronic device 100 can be referred to as an electronic device or a consumer device. Further details of the electronic device 100 are provided below with reference to FIG. 2.

Figure 2:
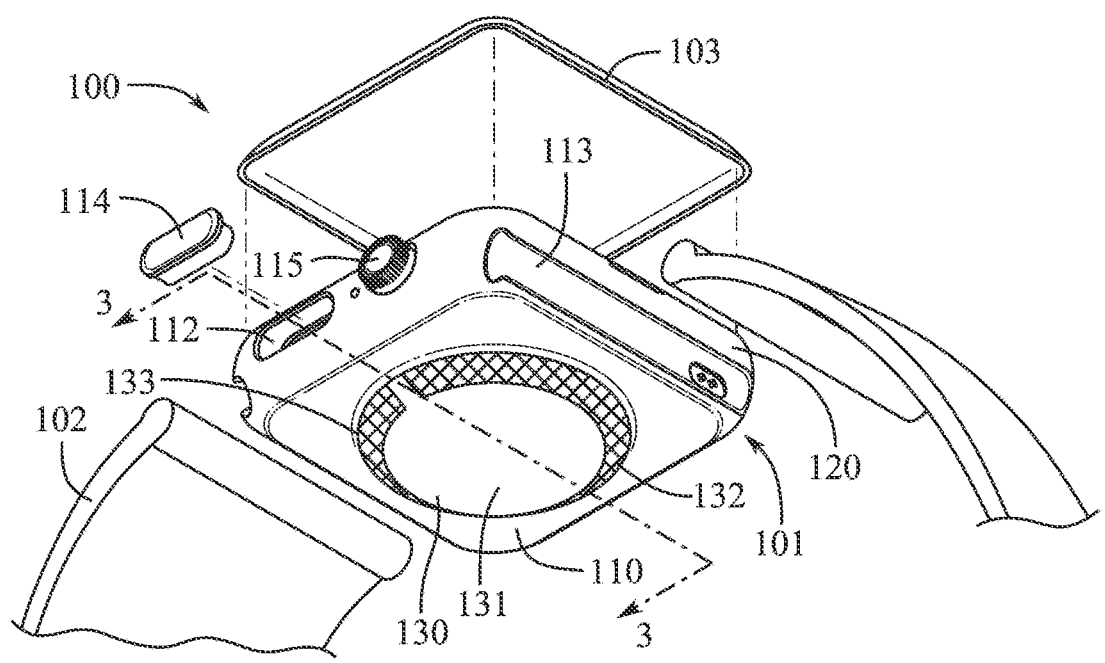
FIG. 2 shows an exploded perspective view of the electronic device of FIG. 1.

Referring now to FIG. 2, the electronic device 100 can include a housing 101, and a cover 103 attached to the housing 101. The housing 101 can substantially define at least a portion of an exterior surface of the device 100, and can include a base and sidewalls 120. The cover 103 can be transparent and can include glass, ceramic, plastic, or any other substantially transparent material, component, or assembly. The cover 103 can cover or otherwise overlay a display, a camera, a touch sensitive surface, and/or other components of the device 100. The cover 103 can define a front exterior surface of the device 100.

A back cover 110 can also be attached to the housing 101, for example, opposite the cover 103. The back cover 110 can include ceramic, plastic, metal, or combinations thereof. In some examples, the back cover 110 can include a component 130. The component 130 can be an at least partially electromagnetically transparent component 130. The component 130 can include a transparent material and can include one or more portions that are transparent to any desired wavelengths of electromagnetic radiation, such as visible light, infrared light, radio waves, or combinations thereof. In some examples, the component 130 can be disposed over one or more sensors housed in the internal volume of the device 100, such as electromagnetic radiation emitters and/or detectors. Together, the housing 101, the cover 103, and the back cover 110 can substantially define an interior volume and an exterior surface of the device 100.

In some examples, the component 130 can include one or more contact electrodes disposed on an exterior surface of the component. For example, the component 130 can include a first contact electrode 132 and a second contact electrode 133. In some examples, the first and second contact electrodes 132, 133 can be designed to provide an electrical contact with a user's skin, for example, when the smartwatch 100 is affixed to the user with a strap 102 that is coupled to the housing 101. In some examples, the contact electrodes 132, 133 can provide an electrical pathway for a signal to be relayed or transmitted from an exterior surface of the electronic device 100 to the interior volume of the device 100. In some examples, the electrical pathway provided by the contact electrodes 132, 133 can be in communication with one or more components, for example, one or more sensors contained in the internal volume of the device 100. One or both of the first contact electrode 132 and the second contact electrode 133 can include a conductive film and a ceramic film.

The device 100 can also include internal components, such as a haptic engine, battery, and system in package (SiP), including one or more integrated circuits, such as processors, sensors, and memory. The SiP can also include a package. The device 100 can further include one or more electromagnetic radiation emitters and detectors, such as light emitting diodes, cameras, optical detectors, infrared detectors, and other detectors and/or emitters. These emitters and detectors can be associated with one or more systems of the device, such as a camera system, vision system, and/or biometric system. The internal components, such as one or more emitters and detectors, can be disposed within an internal volume defined at least partially by the housing 101, and can be affixed to the housing 101 via internal surfaces, attachment features, threaded connectors, studs, posts, or other features, that are formed into, defined by, or otherwise part of the housing 101 and/or the cover 103 or back cover 110. In some examples, the attachment features can be formed on interior surfaces of the housing 101, for example, by machining.

The housing 101 can be a substantially continuous or unitary component, and can include one or more openings 112 to receive input components of the electronic device 100, such as a button 114, and/or to provide access to an internal portion of the electronic device 100. In some examples, the device 100 can include input components such as one or more buttons 114 and/or a crown 115. In some examples, the device 100 can further include a seal or sealant material that can provide an airtight and/or watertight seal at the locations of the openings 112. The electronic device 100 can further include a strap 102, or other component designed to attach the device 100 to a user, or to otherwise provide wearable functionality. In some examples, the strap 102 can be a flexible material that can comfortably allow the device 100 to be retained on a user's body at a desired location. Further, the housing 101 can include a feature or features 113 therein that can provide attachment locations for the strap 102. In some examples, the strap 102 can be retained on the housing 101 by any desired techniques. For example, the strap 102 can include magnets that are attracted with magnets disposed within the housing 101, can include retention components that mechanically retain the strap 102 against the housing 101, or combinations thereof.

Figure 3:
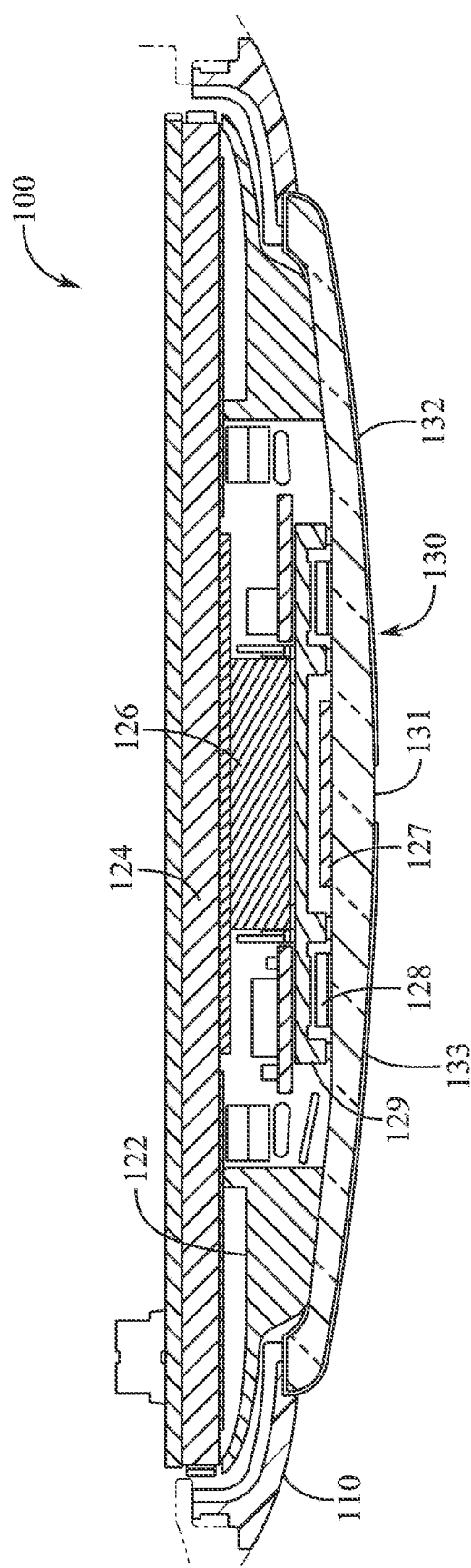
FIG. 3 shows a cross-sectional side view of a portion of the electronic device of FIG. 1.

FIG. 3 shows a cross-sectional view of a portion of the smartwatch 100 illustrated in FIGS. 1 and 2. As described with respect to FIG. 2, the smartwatch 100 can include a back cover 110 and a component 130 coupled to the back cover 110, for example, at an aperture defined by the back cover 110. The component 130 can be sealed to the back cover 110, for example, with an adhesive, a sealant material, a gasket, or by any other desired method or material. That is, in some examples, an interface between the component 130 and the back cover 110 can be sealed with an adhesive, a sealant material, a gasket, or by any other desired method or material. In some examples, the component 130 can include a transparent portion or material 131 that can define an exterior surface and an interior surface of the component 130. A first contact electrode 132 and a second contact electrode 133 can be formed or deposited on an exterior surface of the transparent portion 131, and can extend from the exterior surface to the interior surface. In some examples, one or both of the first contact electrode 132 and second contact electrode 133 can be electrically coupled to one or more components in the interior volume of the device 100, as described herein. For example, because the first contact electrode 132 and/or the second contact electrode 133 can extend from an exterior surface of the transparent portion 131 to an interior surface that can define an internal volume of the device 100, electrical signals can be transmitted from the exterior surface of the device 100 the interior volume, such as to a sensor 126. The internal volume, however, can be and can remain sealed with respect to the ambient environment while the electrical signals can be transmitted through an electric pathway defined by the first contact electrode 132 and the second contact electrode 133. In some examples, the exterior surface and/or the interior surface defined by the component 130 can be non-planar. For example, an exterior surface of the component 130 can be a convex surface, while an interior surface of the component 130 can be a concave surface.

The electronic device 100 can also include a number of components disposed in the internal volume that is at least partially defined by the back cover 110 and the component 130. For example, the electronic device 100 can include a frame 122 that can support one or more internal components, such as a battery 124. The electronic device 100 can also include a support structure 129 that can be coupled to or otherwise support a sensor 126. In some examples, the sensor 126 can be a biometric sensor and can be in electronic communication with one or both of the first contact electrode 132 and the second contact electrode 133. In some examples, the sensor 126 can include an electrocardiography (EKG or ECG) sensor, an electroencephalography (EEG) sensor, an electromyography (EMG) sensor, an electrodermal activity (EDA) sensor, a bioelectrical impedance sensor, other biometric sensors, or combinations thereof.

The electronic device 100 can also include one or more additional components or sensors, such as a light-emitting component 128 and an optical sensor 127. The optical sensor 127 can be designed to receive light that has been transmitted back through the transparent portion 131 after interacting with the ambient environment, such as the portion of the user adjacent to the component 130. In some examples, this light can be emitted by the light-emitting component 128 before interacting with the ambient environment.

In some examples, the device 100 can include sensors such as audio sensors (e.g., microphones), optical or visual sensors (e.g., cameras, visible light sensors, infrared sensors, or ultraviolet light sensors), proximity sensors, touch sensors, force sensors, mechanical devices (e.g., crowns, switches, buttons, or keys), vibration sensors, orientation sensors, motion sensors (e.g., accelerometers or velocity sensors), location sensors (e.g., global positioning system (GPS) devices), thermal sensors, communication devices (e.g., wired or wireless communication devices), resistive sensors, magnetic sensors, electroactive polymers (EAPs), strain gauges, electrodes, or some combination thereof.

In some examples, the sensor 126 can be electrically coupled to both the first contact electrode 132 and the second contact electrode 133, as described herein. In this configuration, a voltage drop resulting from a user's skin contacting the first and second contact electrodes 132, 133 can be monitored by the sensor 126 and, for example, relayed to a processor of the device 100 to measure one or more biometric parameters of a user of the electronic device 100. In some examples, electrical signals provided to the sensor 126 in the internal volume of the device 100 by the first and second contact electrodes 132, 133 can be combined with signals from one or more other sensors of the device, such as an optical sensor 127, to provide an accurate biometric measurement of a user's physical state. Various examples of components, such as housing components including films or layers that can provide electrical pathways between the surfaces of the component and processes for forming the same are described below with reference to FIGS. 4-5B.

FIG. 4 illustrates a top view of a portion of an electronic device that can be similar to, and include some or all of the features of the electronic device 100 described herein with respect to FIGS. 1-3. FIG. 4 shows the interior surfaces of a back cover 210 that can be substantially similar to the back cover 110 described herein, and further shows a component 230 that can be sealed to the back cover 210. In some examples, the component 230 can include a transparent portion and can be sealed to the back cover 210 along the perimeter of the component 230. Although illustrated as a substantially circular component 230, in some examples, the component 230 can include any desired shape. For example, the component 230 can be substantially rectangular, triangular, or any desired polygonal or polyhedral shape. The component 230 can be disposed in an aperture 211 that is at least partially defined by the back cover 210. In some examples, the component 230 can have a peripheral shape that corresponds to, or is substantially similar to, the shape of the aperture 211 defined by the back cover 210. In some examples, the component 230 can be sealed or coupled to the back cover 210 buy a sealant material or a gasket 270 that can be disposed around the periphery of the aperture 211 and/or component 230. In some examples, the sealant material 270 can be an adhesive, glue, gasket, or any other material capable of providing an airtight and/or watertight seal between the component 230 and the back cover 210. Further details of the component 230 are described below with respect to FIGS. 5A and 5B.

Figure 5A:
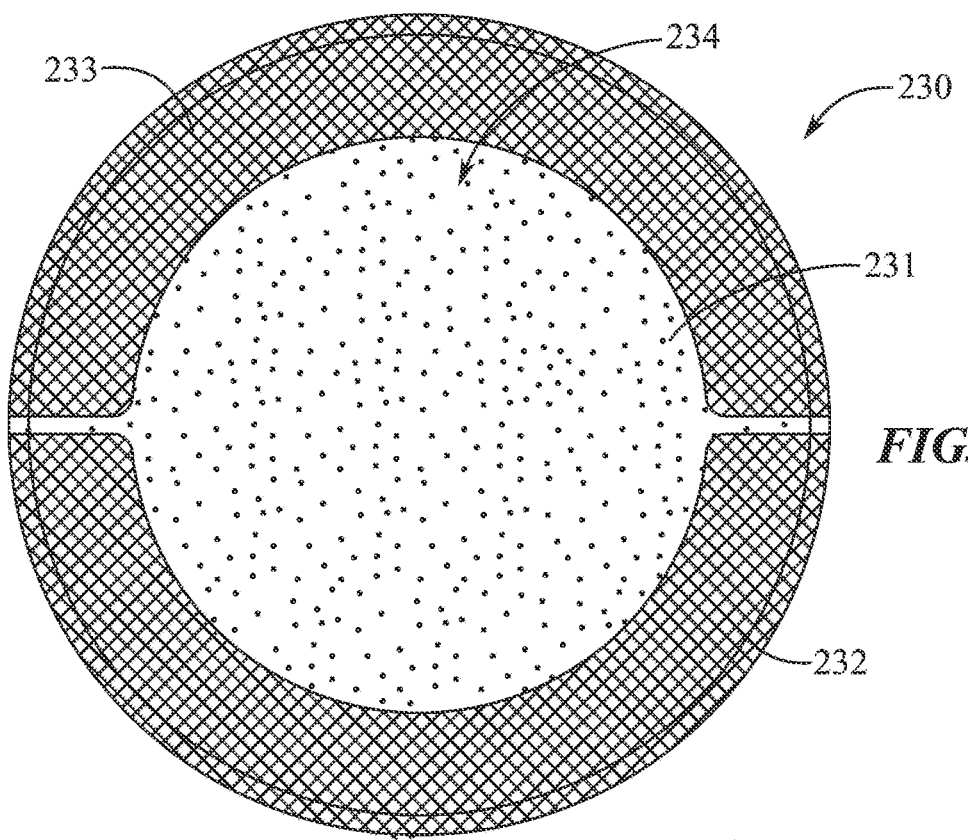
FIG. 5A shows a bottom view of the component of FIG. 4.

FIG. 5A shows a bottom view of the component 230, for example, a portion of the component 230 that can at least partially define an exterior surface of an electronic device including the component 230. As with component 130, the component 230 can include a transparent portion or material 231 that can define an exterior or rear surface 234 of the component 230. In some examples, a first contact electrode 232 and a second contact electrode 233 can be formed or deposited on the exterior surface 234 of the transparent portion 231. In some examples, the first contact electrode 232 and the second contact electrode 233 can have a substantially similar size and/or shape. For example, the first contact electrode 232 and the second contact electrode 233 can have a substantially semicircular shape, and can be formed or deposited on a peripheral portion of the surface 234. In some examples, however, the first and second contact electrodes 232, 233 can be any desired size or shape. Further, in some examples, the first contact electrode 232 and the second contact electrode 233 can cover or be deposited on only a portion of the exterior surface 234 of the component 230. Accordingly, one or more sensors of an electronic device, such as the optical sensors described with respect to FIGS. 2-3, can communicate with and receive light from the ambient environment through the portions of the transparent material 231 that are not covered by the first contact electrode 232 and the second contact electrode 233.

In some examples, the transparent portion 231 can be transparent to one or more ranges of wavelengths of electromagnetic radiation. In some examples, the transparent portion 231 can include a transparent ceramic or polymeric material, such as a polycarbonate material, acrylic material, glass material, sapphire material, or combinations thereof. In some examples, the transparent portion 231 can be a substantially unitary or continuous portion of material, although in some other examples the transparent portion 231 can be formed from multiple portions or components that can be fused or joined together. The transparent portion 231 can be any shape or size, as described herein.

In some examples, one or both of the first contact electrode 232 and the second contact electrode 233 can include one or more thin films. These thin films can be deposited by one or more deposition processes, such as physical vapor deposition (PVD) processes as described herein. The materials of the first contact electrode 232 and the second contact electrode 233 can be chosen to provide a desired level of electrical contact when in physical contact with a desired surface, such as the skin of a user. The materials of the first contact electrode 232 and the second contact electrode 233 can also be chosen to provide desired levels of hardness, durability, or any other material properties. The materials of the first contact electrode 232 and the second contact electrode 233 can include metallic materials, ceramic materials, or combinations thereof. For example, the first contact electrode 232 can include a metallic film including chromium or titanium, and a ceramic film including a ceramic material including chromium or titanium.

Figure 5B:
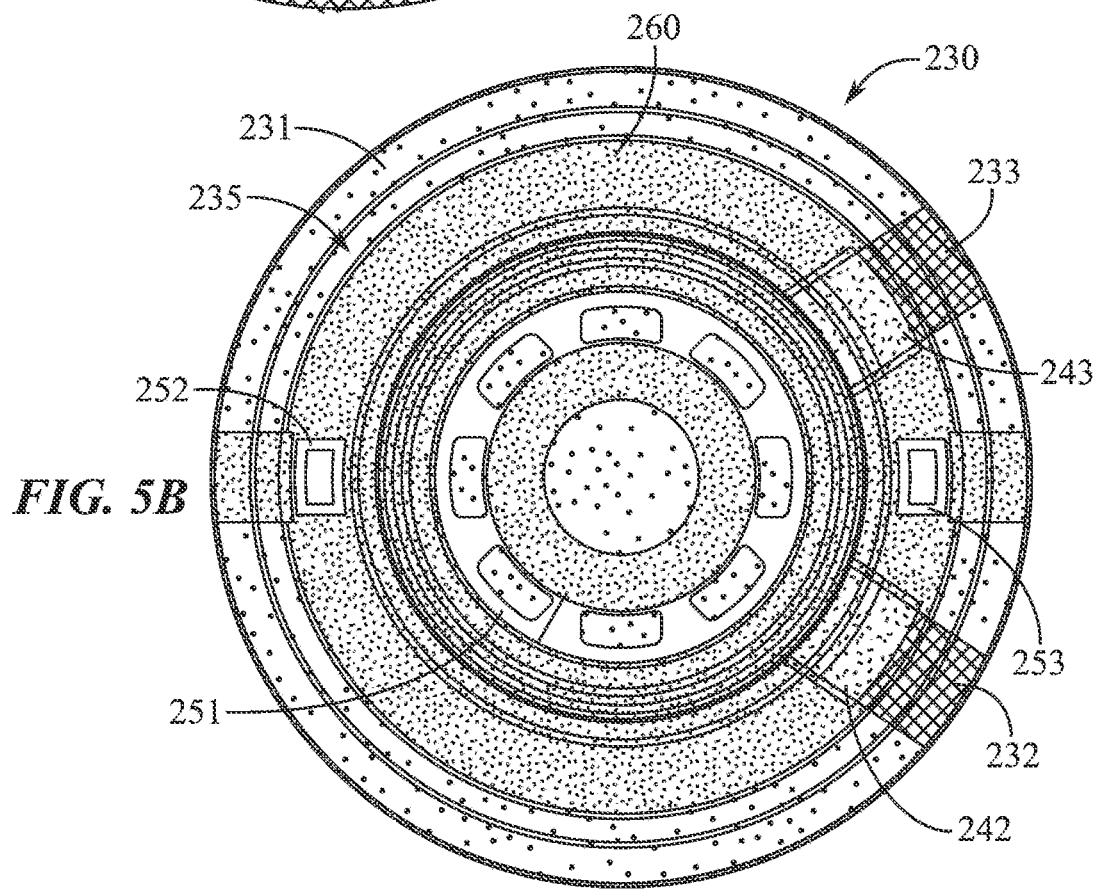
FIG. 5B shows a top view of the component of FIG. 4.

FIG. 5B shows a top view of the component 230 including an interior surface 235 that can at least partially define an internal volume of an electronic device. As can be seen, the first contact electrode 232 can extend from the exterior surface 234 shown in FIG. 5A, around an edge or periphery of the component 230, and to the interior surface 235. Similarly, the second contact electrode 233 can extend from the exterior surface 234 to the interior surface 235. In some examples, an electrically conductive material, or portions of an electrically conductive material, can be formed, deposited, or otherwise placed on the interior surface 235 of the transparent portion 231. In some examples, this conductive material can be a metallic material such as copper, aluminum, any other conductive material, or combinations thereof. In some examples, the portions of conductive material can form one or more electrical contacts that can provide an electrical connection to one or more components of the electronic device, such as the sensors described herein. For example, the portions of conductive material disposed on the interior surface 235 can form or define a first component contact 251, a second component contact 252, and a third component contact 253. These component contacts 251, 252, 253 can be electrically coupled or connected to any desired component in the electronic device, for example, by solder, conductive inks, or any other methods or components.

In some examples, the first contact electrode 232 can be electrically coupled to one or more component contacts 251, 252, 253. For example, the portion of the first conductive electrode 232 that is deposited or formed on the interior surface 235 of the component 230 can be electrically coupled to a component contact 251, 252, 253 by an electrically conductive ink 242 or other conductive material. In some examples, the electrically conductive ink 242 can include conductive particles suspended in a binder material, such as silver particles suspended in a polymer binder. In some examples, this portion of electrically conductive ink 242 can be applied over the first contact electrode 232 and also over one or more component contacts 251, 252, 253 to form an electrical connection therebetween. Accordingly, the first contact electrode 232 can be in electrical communication with one or more components of an electronic device through the first conductive ink portion 242 and one more component contacts to 251, 252, 253. Similarly, the second contact electrode 233 can be electrically coupled to one or more component contacts 251, 252, 253 through a second portion of conductive ink 243. Thus, an electrical pathway can be formed through the first contact electrode 232 and/or the second contact electrode 233 from an exterior surface 234 of the component 230 to the interior volume at least partially defined by the component 230, including one or more sensors or other electronic components, as described herein. In some examples, the first contact electrode 232 and the second contact electrode 233 can be in electrical communication with one another through a shared component contact. In other examples, however, the first contact electrode 232 and the second contact electrode 233 are not in electrical communication with one another.

Although described herein as conductive ink portions 242, 243, in some examples, these portions can include any desired conductive material. For example, the portions 242, 243 can include a solder, adhesive contact material, an electrical connector, or any other conductive material. In some examples, a masking layer 260 can be formed over the conductive material that includes the component contacts 251, 252, 253. In some examples, the masking layer 260 can be an insulating material and can serve to electrically insulate one or more portions of the component contacts to 251, 252, 253 or any other components of an electronic device. Further, the masking layer 260 can serve as an optical masking layer and can optically isolate one or more portions of the component 230 and/or sensors in the device. Various examples of components, such as housing components including films or layers that can provide electrical pathways between the surfaces of the component and processes for forming the same are described below with reference to FIGS. 6-8.

Figure 6:
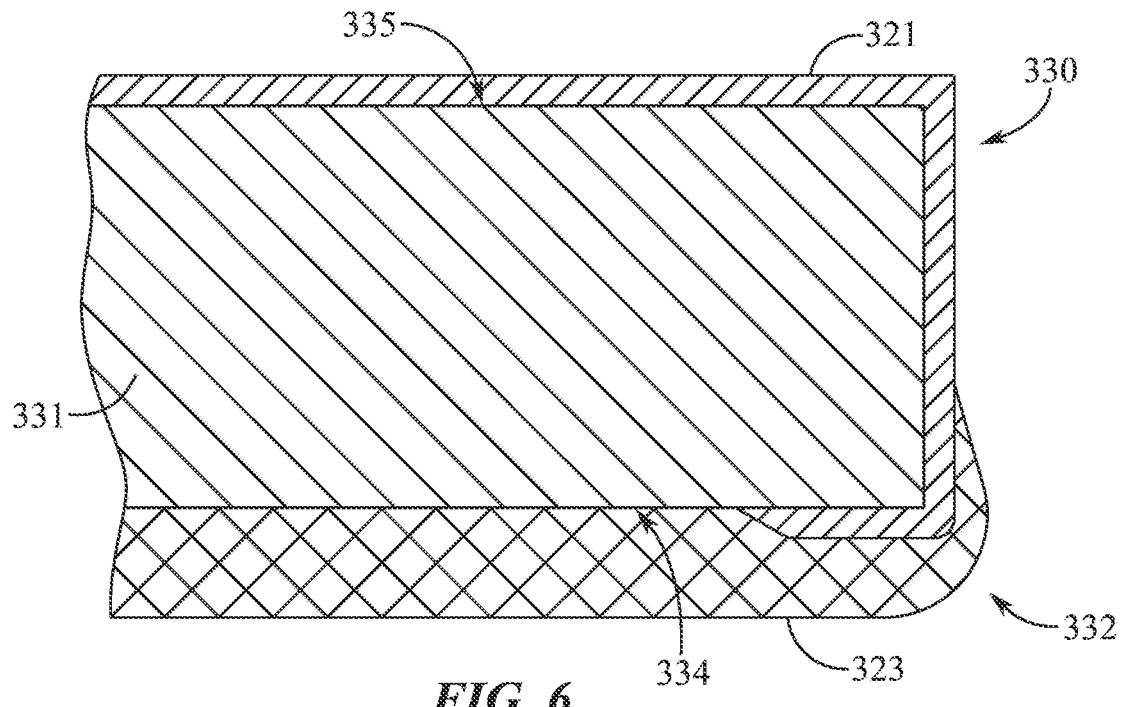
FIG. 6 shows a cross-sectional view of a portion of a component of an electronic device.

FIG. 6 illustrates a portion of a component 330 including a transparent portion or body 331, and a contact electrode 332 including a conductive film 321 and a ceramic film 323 at least partially overlapping the conductive film 321. As can be seen, the transparent portion 331 can define a first surface 334 and a second surface 335 that can be disposed opposite the first surface 335. In some examples, the second surface 335 of the transparent portion 331 can at least partially define an interior volume of an electronic device including the component 330, and can be considered an interior surface of the component 330. Similarly, the surface 334 can at least partially define an exterior surface of an electronic device including the component, and can therefore be in communication with the ambient environment. In some examples, the surface 334 can be considered an exterior surface. Either or both of the surfaces 334, 335 can include any combination of planar and non-planar portions. In some examples, either or both of the surfaces 334, 335 can have non-planar geometries, such as concave or convex geometries. In some examples, either or both of the surfaces 334, 335 can include one or more non-planar features or structures, such as protrusions, indentations, corners, curves, lips, edges, chamfers, other features or structure, or combinations thereof. In some examples, either or both of surfaces 334, 335 can include any non-planar geometry that does not include an undercut feature or structure. Although, in some other examples, either or both of surfaces 334, 335 can include one or more undercuts.

The material forming the transparent portion 331 can be any material that is substantially transparent to a desired range of wavelengths of light. For example, the transparent portion 331 can include a material that is transparent to optical light, infrared light, ultraviolet light, or combinations thereof. In some examples, the transparent portion 331 can include a transparent plastic material such as polycarbonate and/or an acrylic material, a ceramic material such as glass, sapphire, and/or any other desired ceramic material, or combinations thereof. In some examples, the transparent portion 331 can have any desired thickness and can be on the order of about a few millimeters to a few tens of millimeters thick. In some examples, one or more portions of the transparent portion 331 can be as thin as a few hundred microns. Further, in some examples, the transparent portion 331 can have a thickness that varies at locations of the transparent portion 331.

In some examples, the conductive film 321 can be deposited or formed over the interior surface 335 and at least partially over the exterior surface 334, as shown. In some examples, the conductive film 321 can be formed by any desired deposition process or combination of processes, such as physical vapor deposition processes, chemical vapor deposition processes, epitaxial growth processes, electrochemical formation processes, printing processes, ink jetting processes, spraying processes, plating processes, any other known deposition process or process discovered in the future, or combinations thereof. In some examples, the conductive film 321 can have a uniform thickness over the entire region onto which it is deposited. In some examples, however, the thickness of the conductive film 321 can vary depending on the deposition location on the transparent portion 331. Further, in some examples and as described herein, the conductive film 321 can include multiple layers or films of conductive material.

In some examples, the conductive film 321 can include any electrically conductive material or combination of materials. For example, the conductive film 321 can include one or more metals, such as chromium, titanium, copper, aluminum, silver, or combinations thereof. In some examples, the conductive film 321 can be a ductile material. That is, in some examples, the conductive film 321 can be more ductile than the ceramic film 323. The conductive film 321 can have a thickness of from about 10 nanometers (nm) to about 300 nm. In some examples, the conductive film 321 can be from about 25 nm thick to about 200 nm thick, or from about 50 nm thick to about 100 nm thick. For example, the conductive film 321 can be about 50 nm thick or about 100 nm thick. In some examples, the conductive film 321 can be about 100 nm thick on the interior surface 335, and about 50 nm thick on the exterior surface 334.

In some examples, the component 330 can further include a ceramic film 323 that can be formed or deposited on the exterior surface 334 such that the ceramic film 323 at least partially overlaps the portion of the conductive film 321 deposited on the exterior surface 334. In this manner, the ceramic film 323 can be in electrical communication with the conductive film 321, for example, at the location where the films 321, 323 overlap. The ceramic film 323 can include any desired ceramic material, and in some examples, can include a ceramic material that provides a desired level of electrical communication between the ceramic film 323 and a user's skin when in contact therewith. In some examples, the electrical contact between the ceramic film 323 and the user's skin can be, or can include, a form of ionic contact. That is, in some examples, electrical signals can be transmitted or communicated from the user's skin to the ceramic film 323 at least partially by ionic conduction. In some examples, the ceramic film 323 can be formed by any desired deposition process or combination of processes, such as physical vapor deposition processes, chemical vapor deposition processes, epitaxial growth processes, electrochemical formation processes, printing processes, ink jetting processes, spraying processes, plating processes, any other known deposition process or process discovered in the future, or combinations thereof.

In some examples, the ceramic film 323 can include a carbide material, a nitride material, or a carbonitride material. In some examples, the ceramic film 323 can include additional component elements, such as silicon and/or metallic elements. Accordingly, in some examples, the ceramic film 323 can include a carbonitride material such as a silicon carbonitride material. In some examples, the ceramic film 323 can include chromium silicon carbonitride (CrSiCN) or aluminum titanium nitride (AlTiN). In some examples, the ceramic film 323 can include the material or materials of the conductive film 321. For example, where the conductive film 321 includes chromium, the ceramic film 323 can include a ceramic material containing chromium, such as CrSiCN. Similarly, where the conductive film 321 includes titanium, the ceramic film 323 can include a titanium containing ceramic, such as AlTiN. The ceramic film 323 can have any desired thickness, for example, from about 10 nm thick to about 5000 nm (5 microns) thick. In some examples, the ceramic film 323 can be from about 100 nm to about 2500 nm (2.5 microns) thick, or from about 500 nm to about 1000 nm (1 micron) thick. For example, the ceramic film 323 can be about 1000 nm thick. In some examples, the thickness of the ceramic film 323 can vary at various locations on the component 330. In some examples, the ceramic film 323 can have a hardness of greater than about 1000 as expressed by the Vickers Pyramid Number (HV), greater than about 1500 HV, greater than about 2000 HV, greater than about 2500 HV, greater than about 3000 HV, or even greater.

As described herein, the conductive film 321 can include a metallic material that can be more ductile than the ceramic film 323. In this way the conductive film 321 can serve to provide high levels of adhesion between the contact electrode 332 and the transparent portion 331 because the ductile conductive film 321 can conform to the surface of the transparent portion 331 and can also absorb and distribute any stresses that are exerted on the contact electrode 332. The ceramic film 323 can include a ceramic material that, in addition to providing a desired level of electrical communication with the ambient environment, can provide desired levels of other material properties such as hardness, durability, and/or corrosion resistance. As the ceramic film 323 can be deposited on the exterior surface 334 of the transparent portion 331, the ceramic film 323 can at least partially define an exterior surface of an electronic device including the component 330. Accordingly, the material of the ceramic film 323 can have a level of hardness that can withstand everyday use of electronic device in an ambient environment. Similarly, the ceramic material of the ceramic film 323 can have a level of corrosion resistance that can prevent degradation or undesirable levels of corrosion of the ceramic film 323 to enable continued use in a wide range of environments. Through the combination of a relatively hard exterior ceramic film 323 and a relatively ductile conductive film 321 at least partially underlying the ceramic film 323, the contact electrode 332 can achieve desired levels of adhesion to the transparent portion 331 while still maintaining desired levels of hardness and corrosion resistance to withstand exposure to the ambient environment and to maintain a desired level of electrical communication with a user's skin. Further details of a component 430 are described with respect to FIG. 7.

Figure 7:
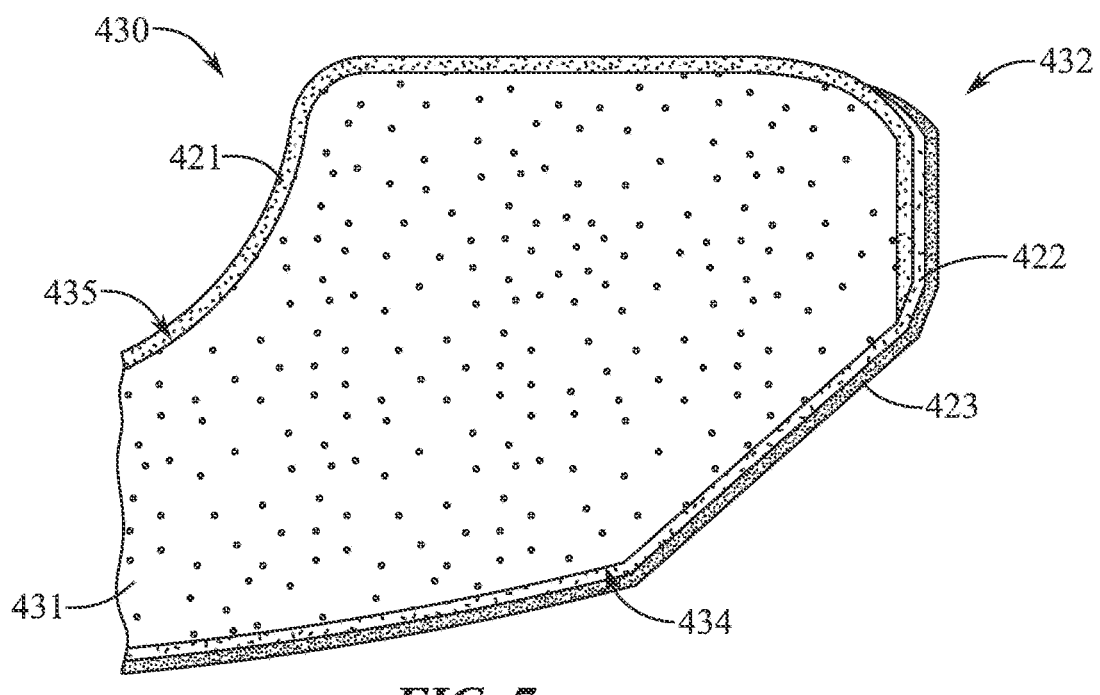
FIG. 7 shows a cross-sectional view of a portion of a component of an electronic device.

FIG. 7 illustrates a cross-sectional view of a portion of a component 430 that can be substantially similar to, and include some or all of the features of the components 130, 230, 330 described herein with respect to FIGS. 1-6. The component 430 can include a transparent portion 431 that includes a transparent material such as a transparent plastic or ceramic material, as described herein. In some examples, the transparent portion 431 can have a non-planar shape or profile. The transparent portion 431 can define a first exterior surface 434 that can at least partially define an exterior surface of an electronic device including the component 430. In some examples, the exterior surface can be a convex surface. The transparent portion 431 can also define an interior surface 435 that can at least partially define an interior volume of an electronic device including the component 430. In some examples, the interior surface 435 can be disposed opposite the exterior surface 434. The interior surface 435 can have a non-planar shape or profile and can, for example, be a concave surface. In some examples, the profiles of the exterior surface 434 and the interior surface 435 can correspond to one another. In some other examples, however, one or more portions of either surface 434, 435 can have a shape that does not correspond to a shape of the opposing surface 434, 435.

In some examples, the component 430 can include a first contact electrode 432 that can include some or all of the features of the contact electrodes 132, 133, 232, 233, 322 described herein. The first contact electrode 432 can include a first conductive film or layer 421 that can be deposited over a portion or region of the interior surface 435, for example, a portion adjacent to a periphery of the transparent portion 431. In some examples, the first conductive film 421 can extend at least partially onto the exterior surface 434 of the transparent portion 431. The first conductive film 421 can include some or all of the features of any of the conductive films or layers described herein. In some examples, the first conductive film 421 can include a metallic material such as chromium, and can have a thickness of about 100 nm.

The first contact electrode 432 can also include a second conductive film or layer 422. The second conductive film 422 can be deposited at least partially on the exterior surface 434 of the transparent portion 431 and can at least partially overlap the first conductive film 421. For example, the second conductive film 422 can at least partially overlap the portion of the first conductive film 421 that is formed or deposited on the exterior surface 434. In some examples, the second conductive film 422 can include the same material as the first conductive film 421. For example, where the first conductive film 421 includes chromium, the second conductive film 422 can also include chromium. In some other examples, however, the second conductive film 422 can include any desired material, such as any conductive material, as described herein. The second conductive film 422 can be in electrical communication with the first conductive film 421. In some examples, the second conductive film 422 can have a thickness of about 50 nm.

In some examples, a metallurgical bond can be formed between the second conductive film 422 and the first conductive film 421 at the portions where the films overlap. In some examples, the second conductive film 422 and the first conductive film 421 can be considered a substantially continuous or unitary film, for example, due to the nature of the deposition processes of the films 421, 422. In some examples, the first conductive film 421 can be formed prior to the second conductive film 422. In some examples, one or more other processes can be carried out on the component 430 in between, prior to, or subsequent to the deposition of the first conductive film 421 and the second conductive film 422. Together, the first conductive film 421 and the second conductive film 422 can be considered a single aggregate conductive film or layer that extends from the exterior surface 434 to the interior surface 435 of the transparent portion 431.

In some examples, the thickness of the aggregate conductive film including the first conductive film 421 and the second conductive film 422 can vary at a number of locations along the transparent portion 431. For example, the aggregate conductive film can have a thickness of about 100 nm at the location on the interior surface 435 where the conductive film includes only the first conductive film 421 and a thickness of about 50 nm at the locations on the exterior surface 434 where the aggregate conductive film includes only the second conductive film 422. In some examples, the thickness of the aggregate conductive film at the location on the transparent portion 431 where the second conductive film 422 overlaps the first conductive film 421 can be about the thickness of the first conductive film 421 added to the second conductive film 422. In some examples, owing to the directional nature of the deposition processes involved and/or the geometry of the transparent portion 431, the first conductive film 421 and/or the second conductive film 422 can have a reduced thickness at the location where the films 421, 422 overlap. Therefore, in some examples, the aggregate conductive film can have a thickness at the overlap location of the first conductive film 421 and the second conductive film 422 that is less than the summed thicknesses of other portions of the first conductive film 421 and the second conductive film 422.

The first contact electrode 432 of the component 430 can further include a ceramic film 423 that is deposited on the exterior surface 434 and that at least partially overlaps the conductive film, for example, the second conductive film 422. The ceramic film 423 can include some or all of the features of any of the other ceramic films described herein, and can have a thickness between about 10 nm and about 5000 nm, for example, a thickness of about 1000 nm. As described herein, the ceramic film 423 can include any carbide, nitride, or carbonitride material including the material of the first conductive film 421 and/or the second conductive film 422. For example, where the first and second conductive films 421, 422 include chromium, the ceramic film 423 can include a chromium containing carbonitride material, such as CrSiCN. The ceramic film 423 can be in electrical communication with the second conductive film 422. Therefore, due to the overlapping positions of the second conductive film 422 and the first conductive film 421, the ceramic film 423 can be in electrical communication with the first conductive film 421 on the interior surface 435. Accordingly, the first contact electrode 432 can define an electrical pathway from the exterior surface 434 through the ceramic film 423, second conductive film 422, and first conductive film 421, to the interior surface 435 where the first conductive film 421 can be electrically coupled to one or more components of an electronic device, for example, through a conductive ink or other conductive material, as described herein.

The portion of the first contact electrode 432 that at least partially defines an exterior surface of the component 430, for example, the portion including the ceramic film 423, can have desired levels of one or more material properties such as hardness, corrosion resistance, and/or durability. Further, because the ceramic film 423 can at least partially define the exterior surface of the device including the component 430 and can best be visible to a user, the ceramic film 423 can have a desired cosmetic or aesthetic appearance as well. In some examples, the material of the ceramic film, for example, the elements including the ceramic film and their respective ratios in the material of the ceramic film 423 can be chosen to provide a desired color and/or brightness to the ceramic film 423.

In some examples, the ceramic film 423 can include CrSiCN having a composition of about 50 weight percent (wt %) chromium, about 30 wt % silicon, and about 10 wt % carbon and nitrogen, with the remainder including any number of additional component elements, such as oxygen. In some examples, the weight percentage of chromium in the ceramic film can be increased to provide a lighter colored ceramic film 423, or decreased to provide a darker colored ceramic film 423, while maintaining other desired material properties. In some examples where the ceramic film 423 includes titanium, such as in an AlTiN ceramic film 423, the weight percentage of titanium can be increased to provide a lighter color to the ceramic film 423, or decreased to provide a darker color to the ceramic film 423, while maintaining other desired material properties. In some examples, the ceramic film 423 can include AlTiN where it is desirable to have a darker cosmetic appearance than a pure CrSiCN film, while the ceramic film 423 can include a TiCN-containing material or a CrTiCN-containing material when a cosmetic appearance lighter than a pure CrSiCN film is desired. In some examples, the ceramic film 423 can have an L* value in the CIELAB color space that can be from about 40 to about 90, from about 50 to about 80, from about 60 to about 70, or from about 55 to about 65, for example, about 60. Further details of an electronic device 500 including a component 530 are described below with reference to FIG. 8.

Additionally, while the configuration of the contact electrode 432 including a first conductive layer 421, a second conductive layer 422, and a ceramic film 423 deposited over at least the second conductive layer 423 can prevent or reduce delamination of one or more layers of the contact electrode 432, in some examples, this configuration can also maintain a desired level of functionality even if some delamination does occur. For example, high stress events and/or extremely high levels of wear can cause some brittle cracking and/or delamination of the ceramic film 423 from the underlying second conductive film 422. In these instances, the electrical pathway from the exterior surface 434 to the interior surface 435 can still be maintained because even though localized delamination of the ceramic film 423 might have occurred, other portions of the ceramic film 423 can maintain electrical contact or communication with the second conductive layer 422 to provide alternative electrical pathways from the ceramic film 423, through the second conductive film 422, to the first conductive film 421.

Figure 8:
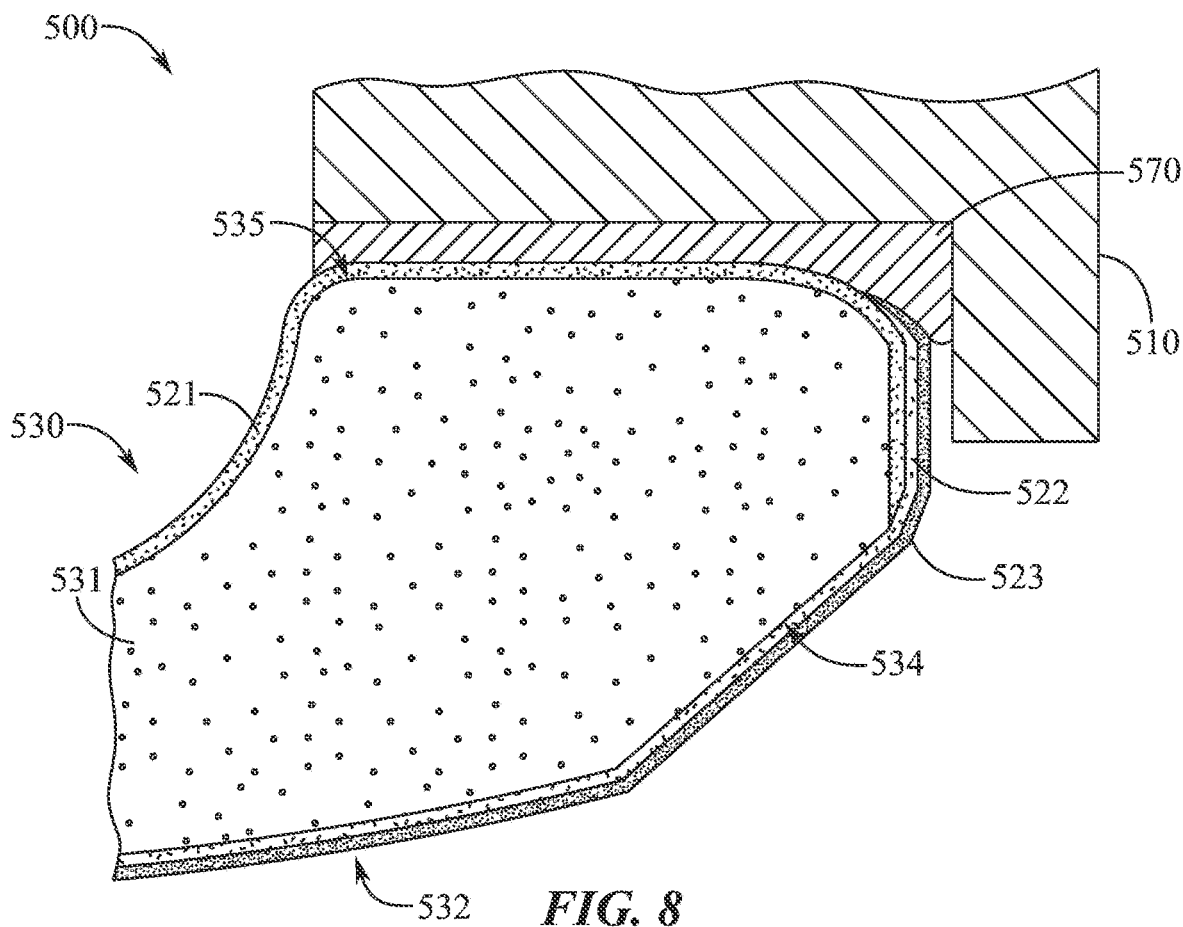
FIG. 8 shows a cross-sectional view of a portion of an electronic device including a component.

FIG. 8 illustrates a cross-sectional view of a portion of an electronic device 500 including a back cover 510 and a component 530, as described herein. The back cover 510 and the component 530 can include some or all of the features of the back covers 110, 210 and components 130, 230, 330, 430 described herein with respect to FIGS. 1-3 and 1-7, respectively. As can be seen, the component 530 can be substantially similar to the component 430 described with respect to FIG. 7. For example, the component 530 can include a transparent portion 531 that can include a transparent polymer or ceramic material such as sapphire.

The component 530 can also include a first-contact electrode 532 that can include some or all of the features of the contact electrodes 132, 133, 232, 233, 332, 432 described herein. For example, the contact electrode 532 can include a conductive layer including a first conductive film 521 deposited on an interior surface 535 of the transparent portion 531, and a second conductive film 522 deposited on the exterior surface 534 of the transparent portion 531. The second conductive film 522 can at least partially overlap the first conductive film 521 to form the aggregate conductive layer. The first conductive film 521 and second conductive film 522 can include some or all of the features of any of the other conductive films described herein. The contact electrode 532 can further include a ceramic film 523 deposited over the exterior surface 534 of the transparent portion 531, and at least partially over the conductive layer, for example, over the second conductive film 522. In some examples, the first conductive film 521 and the second conductive film 522 can include chromium, and the ceramic film 523 can include CrSiCN. In some examples, the first conductive film 521 and the second conductive film 522 can include titanium, and the ceramic film 523 can include AlTiN. As described herein, the first contact electrode 532 can provide or define an electrical pathway from the exterior surface 534 of the component 530, and thus, from the exterior surface of the electronic device 500, to an interior surface of the component 530.

In some examples, the component 530 can be joined to the back cover 510 to form at least a portion of a housing of the electronic device 500. In some examples, the component 530 can be joined, bonded, or adhered to one or more surfaces of the back cover 510, for example, by an adhesive or sealant material 570. As can be seen, the sealant material 570 can occupy a space between the interior surface 535 of the component 530 and one or more surfaces of the back cover 510 to provide a substantially watertight and/or airtight seal between the component 530 and the back cover 510. Accordingly, the internal volume of the electronic device 500 that is at least partially defined by the component 530 and back cover 510 can be sealed and isolated from the ambient environment. As such, some or all of the exterior surface 534 of the component 530 can be exposed to the ambient environment outside the electronic device 500, while some or all of the interior surface of the component 530 can at least partially define the internal volume of the device 500. Thus, in some examples, the location of the seal or sealant material 570 can serve to divide, separate, or isolate the interior surface 535 and the exterior surface 534 of the component 530.

In some examples, the sealant material 570 can be any material that can provide or act as an airtight and/or watertight seal between the component 530 and the back cover 510. In some examples, the sealant material 570 can include a material including one or more polymers. In some examples, the sealant material 570 can include an adhesive, such as a pressure sensitive adhesive, and/or a glue. In some examples, the sealant material 570 can be disposed at, or adjacent to, a periphery of the component 530. In some examples, a peripheral shape of the component 530 can correspond to a peripheral shape of an aperture defined by the back cover 510 in which the component 530 is disposed. In these examples, the sealant material 570 can be disposed around some or all of the periphery of the component 530 and/or the portion of the back cover 510 defining the aperture in which the component 530 is disposed. In some examples, the sealant material 570 can serve to join the component 530 to the back cover 510, such that the component 530 is retained against the back cover 510 exclusively or substantially exclusively by the sealant material 570. In some examples, however, one or more additional retaining features or materials can be used to retain the component 530 against the back cover 510, and a sealant material 570 can serve as a seal between the back cover 510 and the component 530. In some examples, the component 530 can be retained in a desired location relative to the back cover 510 by some combination of retaining features or components and the sealant material 570.

As shown, the first contact electrode 532 can extend from the exterior surface 534 to the interior surface 535 past the sealant material 570. In some examples, therefore, the sealant material 570 can directly contact the first contact electrode 532 to form the seal between the component 530 and the back cover 510. Accordingly, the high levels of adhesion between the layers of the first contact electrode 532, such as the first conductive film 521, and the transparent portion 531 can prevent undesirable delamination or decoupling between the back cover 510 and the component 530. Further, the materials of the first contact electrode 532 can be selected such that they are able to withstand exposure and bonding with the sealant material 570. Thus, in some examples, the electrical pathway defined by the first contact electrode 532 can extend from an exterior surface 534 of the device 500 to an internal volume of the device 500 through or across a seal formed between component 530 and back cover 510. In some other examples, however, the component 530 can additionally or alternatively be bonded or sealed to one or more other housing components of the device 500.

In this way, and as described herein, an electrical signal transmitted or relayed through the first contact electrode 532 can travel along the electrical pathway defined by the first contact electrode 532 from the exterior surface 534 to an internal volume of the device 500 without the need for any openings or apertures of the device 500, and without the need to expose one or more sensors disposed in the internal volume to the ambient environment. The portion of the first contact electrode 532 disposed on the surface 535 that can at least partially define an internal volume of the device 500 can then be electrically coupled to one or more other components of the device 500, such as one or more sensors, as described herein.

Any number or variety of electronic device components can include layers or films of material that can provide an electrical pathway between surfaces of the component as described herein. The process for forming a conductive pathway can include any combination of film or layer formation, or deposition processes in any combination, as described herein. The component can include a conductive film or layer that can extend from one surface of the component to another surface, and a ceramic film formed over and in electrical communication with at least a portion of the conductive film to provide the electrical pathway. Various examples of components, such as housing components including films or layers that can provide electrical pathways between the surfaces of the component and processes for forming the same are described below with reference to FIG. 9.

Figure 9:
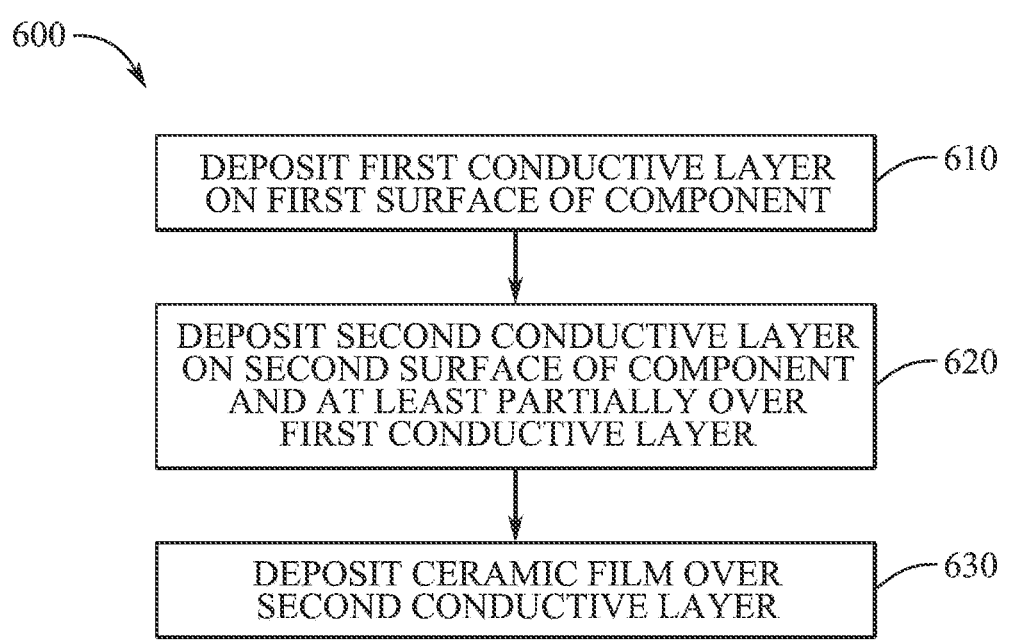
FIG. 9 shows a process flow diagram for forming a component of an electronic device.

FIG. 9 illustrates a process flow diagram of a process for forming an electrically conductive housing component. According to FIG. 9, the process 600 for forming an electrically conductive housing component can include depositing a first conductive layer on a first surface of the component at block 610, depositing a second conductive layer on a second surface of the component and at least partially over the first conductive layer at block 620, and depositing a ceramic film over at least the second conductive layer at block 630.

At block 610, a first conductive layer or film is deposited on a first surface of a component. In some examples, the component can include some or all of the features of the components 130, 230, 330, 430, 530, as described herein with respect to FIGS. 1-8. In some examples, the component can be a housing component of an electronic device. In some examples, the component can be substantially any component of an electronic device. In some examples, the first surface can have a planar surface or a non-planar surface, for example, a surface having a concave or convex geometry. The first surface can include substantially any desired material that is able to withstand the deposition process and can be, for example, a polymeric or ceramic surface such as a transparent polymeric or transparent ceramic surface.

The first conductive layer can be deposited by any desired deposition process or processes, such as physical vapor deposition processes, chemical vapor deposition processes, epitaxial growth processes, electrochemical formation processes, printing processes, inkjetting processes, spraying processes, plating processes, any other known deposition process or process discovered in the future, or combinations thereof. In some examples, the deposition process can be a physical vapor deposition process, chemical vapor deposition process, atomic layer deposition process, or any other desired deposition process capable of depositing a film with the properties described herein. In some examples, the first conductive layer can include any conductive material, such as a metallic material as described herein. For example, the first conductive layer can include chromium, titanium, or any other conductive metal or combinations thereof.

In some examples, the conductive film can have a uniform thickness over the entire region onto which it is deposited. In some examples, however, the thickness of the conductive film can vary depending on the geometry and location onto which it is deposited. Further, in some examples and as described herein, the conductive film can include multiple layers or films of conductive material. The conductive film can have a thickness of from about 10 nm to about 300 nm. In some examples, the conductive film can be from about 25 nm thick to about 200 nm thick, or from about 50 nm thick to about 100 nm thick. For example, the conductive film can be about 50 nm thick or about 100 nm thick. In some examples, the conductive film can be about 100 nm thick at some portions, and about 50 nm thick at some other portions.

In some examples, one or more processing steps can be carried out on the component prior to depositing the first conductive layer thereon. In some examples, one or more regions of the first surface of the component and/or any other surface of the component can be, for example, subjected to a cleaning process, activation process, passivation process, masking process, or combinations thereof.

At block 620 a second conductive layer can be deposited on a second surface of the component and at least partially over the first conductive layer. In some examples, the first conductive layer deposited at block 610 can extend at least partially onto the second surface such that the second conductive layer is deposited over the portion of the first conductive layer on the second surface of the component. In some examples, however, a portion of the second conductive layer can be deposited over the first surface of the component at a location of the first conductive layer in addition to being deposited on the second surface of the component. In some examples, the second surface of the component can be disposed opposite the first surface of the component. In some examples, the second surface of the component can have any desired shape or geometry, and can be a planer or non-planar surface, such as a surface having a convex or concave geometry.

As with the deposition of the first conductive layer at block 610, the second conductive layer can be deposited by any desired deposition process or processes. For example, the second conductive layer can be deposited by one or more physical vapor deposition processes, chemical vapor deposition processes, epitaxial growth processes, electrochemical formation processes, printing processes, ink jetting processes, spraying processes, plating processes, any other known deposition process or process discovered in the future, or combinations thereof. The second conductive layer can have some or all of the properties of the first conductive layer as described with respect to block 610. In some examples, the second conductive layer can include the same or a similar material as the first conductive layer. For example, where the first conductive layer includes a layer of chromium, the second conductive layer can also include a layer of chromium. As a result, in some examples, the deposition of the second conductive layer over the first conductive layer can produce a single layer or film that can be considered a continuous or unitary layer or film. In some examples, however, the second conductive layer can include a different material than the first conductive layer. In some examples, the second conductive layer can have any desired thickness and can have a thickness that is the same as, or different from, the first conductive layer. In some examples, the second conductive layer can be in electrical communication with the first conductive layer such that an electrical signal provided through the second conductive layer is also provided through the first conductive layer.

In some examples, the first surface of the component described with respect to block 610 can be an interior or internal surface of a component, while the second surface of the component can be in external or exterior surface. In some examples, the external surface can at least partially define an external surface of an electronic device including the component, while the internal surface can at least partially define an internal volume of the electronic device, as described herein.

At block 630, a ceramic film can be deposited at least over a portion of the second conductive layer that was deposited at block 620. In some examples, the ceramic film can also be deposited over a portion of the first conductive layer described with respect to block 610. The ceramic film can include some or all of the features and properties of any of the ceramic films described herein, such as ceramic films 323, 423, 523 described with respect to FIGS. 5A-8.

In some examples, the ceramic film can include a carbide material, a nitride material, or a carbonitride material. In some examples, ceramic film can include additional component elements, such as silicon and/or metallic elements. Accordingly, in some examples, the ceramic film can include a carbonitride material such as a silicon carbonitride material. In some examples, ceramic film can include chromium silicon carbonitride (CrSiCN) or aluminum titanium nitride (AlTiN). In some examples, the ceramic film can include the material or materials of the conductive layers deposited at blocks 610, 620. For example, where the conductive films include chromium, the ceramic film can include a ceramic material containing chromium, such as CrSiCN. Similarly, where a conductive film includes titanium, the ceramic film can include a titanium containing ceramic, such as AlTiN. The ceramic film can have any desired thickness, for example, from about 10 nm thick to about 5000 nm thick. In some examples, the ceramic film can be from about 100 nm to about 2500 nm thick, or from about 500 nm to about 1000 nm thick. For example, the ceramic film can be about 1000 nm thick. In some examples, the thickness of the ceramic film can vary at different locations on the component. In some examples, the ceramic film can have a hardness of greater than about 1000 HV, greater than about 1500 HV, greater than about 2000 HV, greater than about 2500 HV, greater than about 3000 HV, or even greater.

In some examples, the ceramic film can be in electrical contact or communication with the first and second conductive layers that were deposited at blocks 610 and 620. In some examples, while the ceramic film is not considered a conductive material in a conventional or traditional sense, the nature of the contact between the ceramic film and a desired surface, such as a user's skin, as well as the sheet resistance and thickness of the ceramic film, can serve to provide an electrical signal from a user's skin to the first and second conductive layers, whereupon it can be communicated to one or more components of an electronic device. Accordingly, even though the ceramic material is not typically considered a highly conductive material, the ceramic material can be conductive enough to provide an electrical signal from an exterior of the component to an interior surface, such as the first surface of the component, whereupon it can be communicated or received by one or more components of an electronic device, as described herein.

In some examples, one or more processing steps can be carried out after the deposition of the ceramic film at block 630, and/or at any time before or after the process steps described with respect to blocks 610, 620. For example, a masking process or cleaning process can be carried out on the component after each of blocks 610, 620, 630. Additional process steps, for example, the application of a conductive ink to an exposed region of the first conductive layer can also be carried out at any desired time. Further, in some examples, the steps of blocks 610, 620, 630 can be carried out in any desired order. In some examples, however the first conductive layer can be deposited prior to the second conductive layer and the ceramic film, while the second conductive layer can be deposited subsequent to the first conductive layer and prior to depositing ceramic film, and the ceramic film can be deposited subsequent to the deposition of the first conductive layer and the second conductive layer. In some examples, block 610 can be carried out before substantially any other processing is performed or conducted on the component, except, in some examples, for forming and cleaning processes. In this way, block 610 can be carried out before other processes that can introduce contamination to the component or deposition apparatus, thereby ensuring a desired level of adhesion between the first conductive film and the surface of the component.

In some examples, the deposition steps described at blocks 610, 620, 630 can be carried out in a single deposition chamber or apparatus, or can be carried out in one or more different deposition chambers or apparatuses. For example, a single deposition chamber or apparatus can contain targets or components to provide for the deposition of the first conductive layer, second conductive layer, and ceramic film, and these components can be activated or used at desired times and for desired durations in order to perform the method 600, as described herein.

Any of the features or aspects of the components discussed herein can be combined or included in any varied combination. For example, the design and shape of the components including electrical pathways are not limited in any way and can be formed by any number of processes, including those discussed herein. A component including one or more contact electrodes, as discussed herein, can be or can form all or a portion of a component, such as a housing or enclosure, for an electronic device. The component can also be or form any number of additional components of an electronic device, including internal components, external components, cases, surfaces, or partial surfaces.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

As used herein, the terms exterior, outer, interior, inner, top, and bottom are used for reference purposes only. An exterior or outer portion of a component can form a portion of an exterior surface of the component but does not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   a housing component defining an interior surface and an exterior surface of the electronic device;
   a first film deposited on the interior surface and extending at least partially around an edge of the housing component onto the exterior surface; and
   a second film deposited on the exterior surface and at least partially over a portion of the first film on the exterior surface, the second film in electrical communication with a portion of the first film deposited on the interior surface.

2. The electronic device of claim 1, further comprising:
   a seal isolating an internal volume of the electronic device from an ambient environment, the internal volume at least partially defined by the interior surface; and
   an electronic component disposed in the internal volume and electrically coupled to the second film, wherein the exterior surface is exposed to the ambient environment.

3. The electronic device of claim 1, wherein the first film comprises at least one of chromium or titanium.

4. The electronic device of claim 1, wherein the first film comprises a metal material.

5. The electronic device of claim 1, wherein the second film comprises a nitride material.

6. The electronic device of claim 1, wherein the second film comprises a ceramic material.

7. A housing for an electronic device, comprising:
   a conductive film deposited on a first surface of the housing and extending around a peripheral edge of the housing at least partially onto a second surface of the housing opposite the first surface;
   a non-metallic film layer deposited on the second surface and at least partially over a portion of the conductive film deposited on the second surface; and
   the conductive film and the film layer forming an electrically conductive pathway extending from the first surface to the second surface.

8. The housing of claim 7, further comprising a conductive ink in electrical contact with a portion of the conductive film on the first surface.

9. The housing of claim 7, wherein at least one of the film layer or the conductive film is deposited by a physical vapor deposition process.

10. The housing of claim 7, wherein the conductive film comprises:
    a first conductive layer deposited on the first surface; and
    a second conductive layer deposited on the second surface and at least partially over the first conductive layer.

11. The housing of claim 10, wherein:
    the first conductive layer is formed prior to the second conductive layer; and
    the film layer is formed subsequent to the first conductive layer and the second conductive layer.

12. The housing of claim 10, wherein:
    the first conductive layer has a thickness of about 100 nanometers; and
    the second conductive layer has a thickness of about 50 nanometers.

13. The housing of claim 7, wherein the conductive film comprises at least one of chromium or titanium.

14. The housing of claim 7, wherein the film layer comprises a conductive ceramic material.

15. The housing of claim 14, wherein the film comprises a nitride including at least one of chromium or titanium.

16. The housing of claim 7, wherein the first surface comprises a non-planar surface.

17. The housing of claim 7, wherein the film has an L* value of 55 to 65 in a CIELAB color space.

18. A method of forming a housing component, comprising:
    depositing a first conductive layer on a first surface of the housing component;
    depositing a second conductive layer on a second surface of the housing component opposite the first surface, the second conductive layer at least partially overlapping the first conductive layer at a peripheral edge of the housing; and
    depositing a third layer over the second conductive layer.

19. The method of claim 18, wherein the second conductive layer comprises at least one of chromium or titanium and the third layer comprises a nitride material including at least one of chromium or titanium.

20. The method of claim 18, wherein the housing component is a first housing component, the method further comprising sealing an interface between the first housing component and a second housing component.

* * * * *